United States Patent
Chen et al.

[11] Patent Number: 6,130,477
[45] Date of Patent: Oct. 10, 2000

[54] THIN ENHANCED TAB BGA PACKAGE HAVING IMPROVED HEAT DISSIPATION

[76] Inventors: Tsung-Chieh Chen, No. 31, Aly. 37, Tung-Yuan St., Taipei; Ken-Hsiung Hsu, No. 30, Aly. 17, Ln. 452, Pao-Shan Rd. HsienHou Li, Hsinchu; Yi-Liang Peng, No. 14, Aly.1, Ln. 22, Hua-Yang St. Chutung Town, Hsinchu; Cheng-Chieh Hsu, 4F, No. 20, Ln. 385, Sec. 1, Kuang-Fu Rd., Hsinchu, all of Taiwan

[21] Appl. No.: 09/270,807

[22] Filed: Mar. 17, 1999

[51] Int. Cl.$^7$ .......................... H01L 23/31; H01L 23/48; H01L 23/34
[52] U.S. Cl. .......................... 257/712; 257/737; 257/738; 257/713; 257/778; 257/675; 257/669; 257/717; 257/673
[58] Field of Search ..................... 257/737, 738, 257/734, 777, 778, 669, 673, 676, 712, 713, 675, 796, 717, 770, 693

[56] References Cited

U.S. PATENT DOCUMENTS

| | | |
|---|---|---|
| 4,742,023 | 5/1988 | Hasegawa ........................ 438/614 |
| 4,977,441 | 12/1990 | Ohtani et al. ..................... 257/48 |
| 5,083,191 | 1/1992 | Ueda . |
| 5,352,926 | 10/1994 | Andrews ......................... 257/717 |
| 5,414,299 | 5/1995 | Wang et al. ..................... 257/702 |
| 5,448,106 | 9/1995 | Fujitsu ........................... 257/668 |
| 5,619,070 | 4/1997 | Kozono .......................... 257/692 |
| 5,710,459 | 1/1998 | Teng et al. ...................... 257/717 |
| 5,777,386 | 7/1998 | Higashi et al. .................. 257/737 |

*Primary Examiner*—Alexander Oscar Williams

[57] ABSTRACT

A thin enhanced TAB BGA package includes an IC chip, a substrate having a center opening and one side laid with a metallic circuitry which has a plurality of inner leads extending to the center opening, a plurality of metallic solder balls attached to the substrate at one side and coupling with the metallic circuitry, and a heat dissipating member adhering partly to the a side of the chip and partly to the substrate for heat dissipating, positioning and supporting the IC chip and the substrate. The IC chip has a another side exposed to ambience to add heat dissipating effect. The heat dissipating member has about same thickness as the substrate. Hence the ball grid array package may be made of a small size and thin thickness. The adhering of heat dissipating member to the chip and substrate may be done at the same process of bonding the inner leads to the IC chip. Thus the thin enhanced TAB BGA package of this invention may be produced at low cost without additional equipment or process.

20 Claims, 2 Drawing Sheets

THIN ENHANCED TAB BGA PACKAGE HAVING IMPROVED HEAT DISSIPATION

BACKGROUND OF THE INVENTION

1. Field of the Invention

This invention relates to a ball grid array integrated circuit package (BGA IC Package) and particularly to a low cost integrated circuit package that has good heat dissipating property and small size.

2. Description of the Prior Art

In semiconductor integrated circuit (IC) industry nowadays, how to make IC packages small size with good heat dissipating property at low cost is a goal almost universally pursued.

In order to resolve the problems of traditional IC package which uses lead frame, a TBGA (Tape Ball Grid Array) package has been developed. FIG. 1 illustrates a typical TBGA package 10 which includes an IC chip 11, a TAB Tape (Tape Automated Bonding Tape) 12 which has metallic circuitry layers 121 formed thereon and a plurality of solder balls 13 attached to the bottom surface of the TAB Tape 12. Between the TAB Tape 12 and the solder balls 13, there is a non-conductive solder ball mask 14 for preventing short circuit of the metallic circuitry 121 resulting from large size solder balls 13.

TBGA package has the advantage of thin TAB Tape 12 (vs. traditional BGA package using printed circuit board as substrate). It is desirable for multi-layer circuit design and may be adapted for etching process. The metallic circuitry 121 may form inner leads 122 toward a center opening formed in the TAB Tape 12. The inner leads 122 are than coupled with bonding pads 111 on the IC chip 11 by means of Tape Automated Bonding (TAB). This method may produce complex metallic circuitry 121 and simplifies packaging process and results in lower cost. The bottom surface of the TAB Tape 12 has large area and thus may support large number of solder balls 13 and leads.

However TBGA package has poor heat dissipating property. A layer of underfilling 15 is usually needed to mold over the top of the chip 11 for protecting the chip 11 and the leads 122. The underfilling 15 which is made from polymer resin (e.g., epoxy) not only adds the height of the package but also has poor heat conductivity, and thus results in poor heat dissipation of the chip 11. This problem becomes a drag to the performance of the chip 11.

In order to fix the problem mentioned above, another TBGA packaging scheme has been introduced. FIG. 2 shows such an example. The TBGA package 20, like the one shown in FIG. 1, also has an IC chip 21, a TAB Tape 22 and a plurality of solder balls 23. There are also inner leads 222 engaged with bonding pads 211 by means of TAB at a center opening of the TAB Tape 22. However the active side of the chip 21 is faced down (toward the TAB Tape 22). The underfilling 25 is molded at the opening below the chip 21 and covers the surrounding area of the opening. The other side of the chip 21 thus may be exposed to outside to enhance heat dissipating effect. However due to the TAB Tape 22 is generally thin and soft, it needs to add a support layer 26 made of epoxy on an opposite side to the solder balls 13 to enhance its mechanical strength. The addition of the support layer 26 increases package thickness and fabrication procedures. It also needs additional equipments and production facilities. Total cost thus will increase. As the active side of the chip 21 is still covered by the underfilling 25, heat dissipating effect does not improve very much.

FIG. 3 shows yet another TBGA package example. Like previous examples, this TBGA package 30 also includes an IC chip 31, a TAB Tape 32, a plurality of solder balls 33 and a bottom underfilling 35. The TAB Tape 32 also has inner leads 322 extending toward a center opening and being soldered with bonding pads 311. However it has a large size heat sink 36 covering the top of the chip 31 and the TAB Tape 32 to dissipate heat more effectively. The heat sink 36 also serves to support the chip 31 and the TAB Tape 32. But the addition of the heat sink 36 also increases total package thickness, fabrication process and production facility investment.

All of this indicates that there is still a lot of room for improvement regard producing low cost IC package which has small size and high heat dissipating property.

SUMMARY OF THE INVENTION

In view of aforesaid disadvantages, it is therefore an object of this invention to provide a thin enhanced TAB BGA package that has good heat dissipating property, small size, simple fabrication procedures, and may be produced at low cost without additional facility.

The BGA package according to this invention includes an IC chip which has at least one active side laid with semiconductor circuits, a substrate which has at least one surface laid with a metallic circuit and a center opening, and a plurality of metallic balls mounted on the substrate and coupled with the metallic circuit. The metallic circuit further has inner leads extending toward the center opening. The improvements of the BGA package comprise: the BGA package has a heat dissipating member attached to the active side of the chip by means of a non-conductive adhesive (i.e. the heat dissipating member and the substrate are located on same side of the chip). The heat dissipating member further has a center portion adhering to the active side of the chip, an intermediate portion adhering to the inner leads and an outskirt portion adhering to the substrate. Hence besides dissipating heat for the chip, the heat dissipating member may also provide support and positioning function for the package. Moreover the chip has another side opposite to the active side exposing to outside ambience. Thus both sides of the chip are able to dissipate heat. It therefore can provide much better heat dissipating effect than conventional one. The thickness of this invention is also smaller. Bonding of the heat dissipating member to the active side of the chip may be done along with the process of bonding the leads to the bonding pads of the chip. Therefore the BGA package of this invention may be fabricated without additional equipment and at lower cost than the conventional TBGA package.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENT

The BGA IC package according to this invention includes a heat dissipating member bonded to the same side of an IC chip as the substrate. The bonding process may be done along with bonding inner leads of the substrate to the chip, which means, the heat dissipating member can be used as a "bonding mold" for bonding the inner leads onto the chip. The heat dissipating member can also provide supporting function during the bonding process as it has a material strength much higher than the substrate. No additional fabrication process or equipment is needed. Hence it may be produced at low cost. The chip has one side exposed and another side adhering to the heat dissipating member. Therefore both sides of the chip may dissipating heat and result in greater heat dissipating efficiency. The heat dissipating member takes substantially the same thickness as the substrate. The package thus may be made small size.

Figure 1:
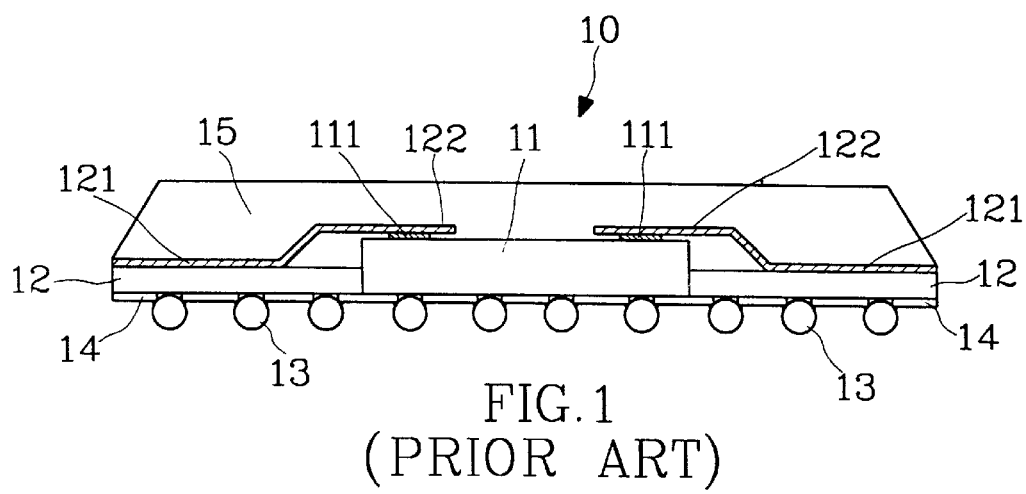
FIG. 1 is a schematic view of an embodiment of a conventional BGA package 10.
Figure 2:
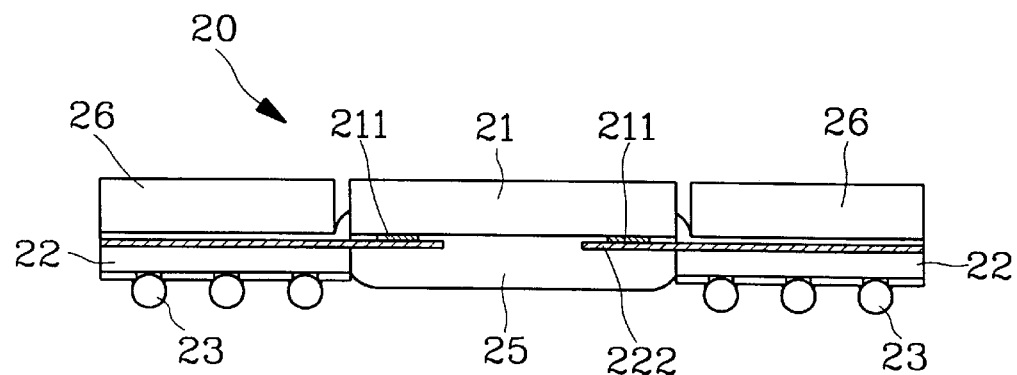
FIG. 2 is a schematic view of another embodiment of a conventional BGA package 20.
Figure 3:
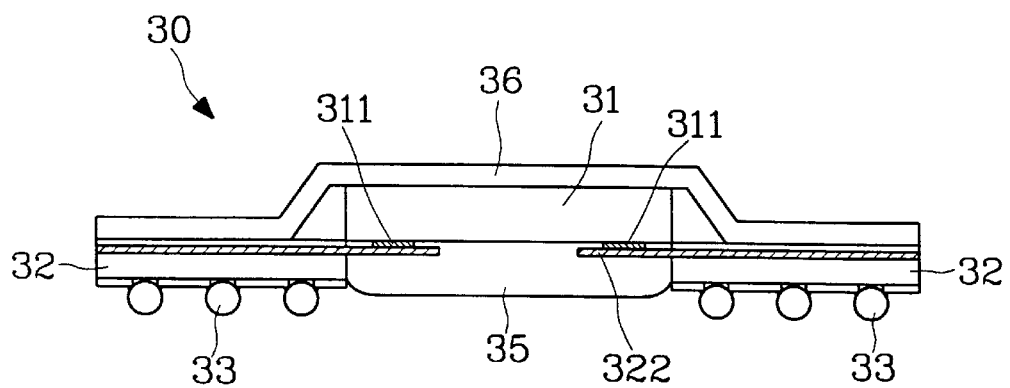
FIG. 3 is a schematic view of further embodiment of a conventional BGA package 30.
Figure 4:
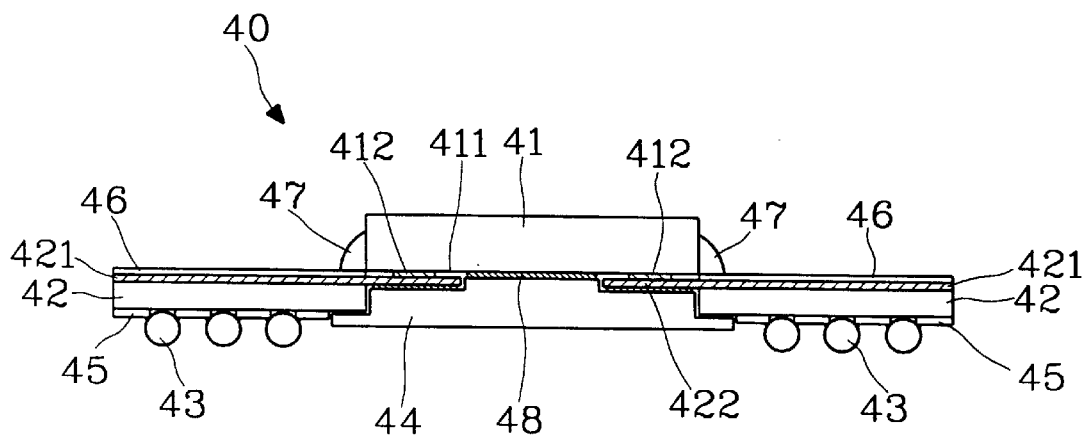
FIG. 4 is a schematic view of an embodiment of a BGA IC package according to this invention.
Figure 5:
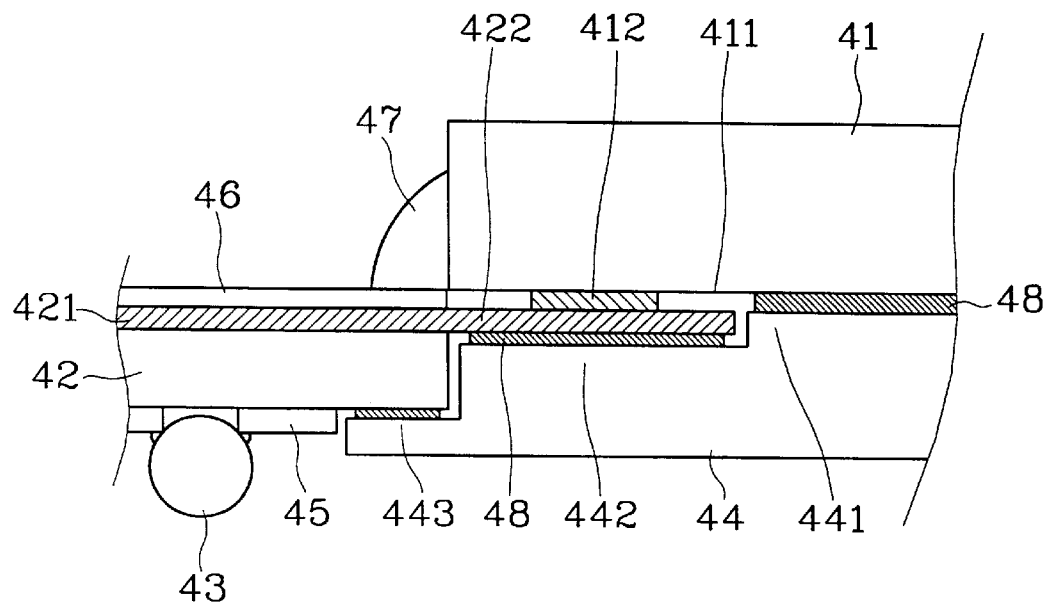
FIG. 5 is a fragmentary sectional view of this invention showing a chip 41, a heat dissipating member 44 and a substrate 42.

FIGS. 4 and 5 illustrate an embodiment of a BGA IC package 40 according to this invention. It includes an IC chip 41, a substrate 42, a plurality of metallic solder balls 43 and a specially formed heat dissipating member 44.

The chip 41 has at least one active side 411 laid with IC layout and a plurality of bonding pads 412. The substrate 42 is made of an insulative polymer commonly known as TAB tape (Tape Automated Bonding Tape). Traditional Printed Circuit Board (PCB) may also be used as substrate. The substrate 42 has at least one side laid with a metallic circuit 421. The metallic circuit 421 is formed by depositing, sputtering, electroplating or adhering or other desirable means at least one conductive layer made of gold, copper, iron, nickel or their alloys on a surface of the substrate 42, and then through the process of etching, ion cutting, laser cutting or other desirable processes. At the center of the substrate 42, there is a center opening. The metallic circuit 421 has a plurality of inner leads 422 extending into the center opening. The inner leads 422 then are soldered to the bonding pads 412 of the chip 41 to couple with the circuits laid on the active side 411. Upon the metallic circuit 421, there may be provided with a layer of protective insulating material 46 such as resin or epoxy through spreading, adhering, depositing or other desirable process.

The solder balls 43 may be made of conductive material such as tin, gold, silver and the like. They are generally mounted on the substrate 42 by means of heat soldering and coupled with the metallic circuit 421 through conductive plugs (not shown in the figures). A non-conductive solder ball mask 45 may also be formed on the surface of the substrate 42 and surround the solder balls 43 for preventing short circuit of the metallic circuit 421 resulting from oversize solder balls 43.

The heat dissipating member 44 may be made of a good heat conducting material such as aluminum, copper, iron, nickel and the like formed in a thin plate. The heat dissipating member 44 is adhered to the active side 411 of the chip 41 by means of non-conductive adhesive 48. That means, the heat dissipating member 44 is located at the same side of the chip 41 as the substrate 42. The adhesive 48 may be epoxy, dual-sided adhesive tape or the like.

In a preferred embodiment of this invention, the heat dissipating member 44 is formed with a step top surface and a flat bottom surface. The step top surface has a thickest center portion 441 adhering to the chip 41 on the active side 411, an intermediate portion 442 adhering to the inner leads 422 and a thin outskirt portion 443 adhering to the substrate 42. The thickness of the heat dissipating member 44 is about the same of the substrate 42. The center portion 441 and the intermediate portion 442 are located in the center opening. Therefore the heat dissipating member 44 may be included in the package at substantially the same thickness level as the substrate 42 without increasing the total thickness of the BGA package. The bottom surface of the heat dissipating member 44 may also be made corrugated form (not shown in the figures) to increase heat dissipating area.

Furthermore adhering of center portion 441 to the active side 411 of the chip 41, adhering of the intermediate portion 442 to the inner leads 422 and adhering of the outskirt portion 443 to the substrate 42 may be done at the same time when taping the inner leads 422 to the bonding pads 412. Eventually the step-surfaced heat dissipating member 44 may serve as a "press mold" to facilitate the taping of the inner leads 422 to the bonding pads 412. Hence no extra process or equipment is needed when making the BGA package of this invention. Moreover the heat dissipating member 44 with its step surface may provide positioning and support function for the chip 41 and the substrate 42. The perimeter surface of the chip 41 normal to the substrate 42 may be filled with underfilling (e.g., epoxy) 47 to securely hold the chip 41 on the substrate 42.

As both the top surface of the chip 41 and the active side 411 through the heat dissipating member 44 may dissipating heat of the chip 41, heat dissipating efficiency thus is much greater than conventional BGA package.

In summary, the BGA IC package according to this invention offers good heat dissipating efficiency, simple fabrication process without extra equipment and may be produced at low cost, and less thickness than conventional BGA package.

It may thus be seen that the objects of the present invention set forth herein, as well as those made apparent from the foregoing description, are efficiently attained. While the preferred embodiment of the invention has been set forth for purpose of disclosure, modifications of the disclosed embodiment of the invention as well as other embodiments thereof may occur to those skilled in the art.

For instance, the non-conductive adhesive 48 may be a dual-sided adhesive tape for adhering the heat dissipating member 44 with the chip 41, inner beds 422 and substrate 42 and partly covering the mating surface between them (as shown in FIGS. 4 and 5). EPOXY resin or other desirable non-conductive may also be used as adhesive 48 to fill the mating surface completely. Accordingly, the appended claims are intended to cover all embodiments which do not depart from the spirit and scope of the invention.

What is claimed is:

1. A thin enhanced TAB BGA package having improved heat dissipation comprising:

a semiconductor chip having an active side with semiconductor circuitry formed thereon, and a second side opposite from the active side;

a substrate having a center opening therethrough, and first and second opposite facing substrate sides, at least the first substrate side having metallic circuitry formed thereon which circuitry has a plurality of inner leads, the inner leads having one end extending into the center opening and coupled with the semiconductor circuitry of the semiconductor chip;

a plurality of solder balls attached to the second substrate side and coupled with the metallic circuitry of the substrate, the second substrate side with the solder balls facing in the same direction as the active side of the semiconductor chip; and a heat dissipating member for dissipating heat generated in the semiconductor chip and for supporting the chip and the substrate, said heat dissipating member having a center portion extending through the center opening in the substrate and adhered to the active side of the semiconductor chip, an intermediate portion adhered to the inner leads extending into the center opening and an outskirt portion adhered to the substrate, the adhering being by a non-conductive adhesive.

2. The thin enhanced TAB BGA package of claim 1, wherein the substrate comprises a Tape Automated Bonding Tape.

3. The thin enhanced TAB BGA package of claim 1, wherein the metallic circuitry comprises a material selected from a group consisting of gold, aluminum, copper, iron, nickel and their alloys.

4. The thin enhanced TAB BGA package of claim 1 further comprising a plurality of bonding pads located on the active side of the semiconductor chip coupled with the inner leads.

5. The thin enhanced TAB BGA package of claim 4, wherein coupling of the inner leads with the bonding pads is done by bonding and is accompanied by press adhering of the heat dissipating member to the active side of the chip.

6. The thin enhanced TAB BGA package of claim 1, wherein the non-conductive adhesive is dual-sided adhesive tape.

7. The thin enhanced TAB BGA package of claim 1, wherein the heat dissipating member is made of a material selected from a group consisting of aluminum, copper, iron, nickel, gold and their alloys.

8. The thin enhanced TAB BGA package of claim 1, wherein the heat dissipating member has a step-shaped cross-sectional configuration, a center portion having a greatest thickness and engaging with the chip, an intermediate portion having a medium thickness and engaging with the inner leads, and an outskirt portion having a least thickness and engaging with the substrate.

9. The thin enhanced TAB BGA package of claim 8, wherein the heat dissipating member has non-conductive adhesive located on surfaces adhering to the chip, inner leads and substrate.

10. The thin enhanced TAB BGA package of claim 1 further comprising an underfilling adhering to a perimeter of the chip and a substrate surface adjacent to the perimeter.

11. The thin enhanced TAB BGA package of claim 1, wherein the second side of the chip is exposed to ambient atmosphere to facilitate heat dissipation.

12. A thin enhanced TAB BGA package having improved heat dissipation, comprising:

a semiconductor chip laid with semiconductor circuitry on an active side, the semiconductor chip having a second side facing opposite from the active side;

a tape automated bonding tape substrate having a center opening, and first and second opposite facing substrate sides, at least the first side having a metallic circuitry which has a plurality of inner leads, the inner leads having one end extending into the center opening and coupled with the semiconductor circuitry of the semiconductor chips, the chip being located on the first substrate side;

a plurality of metallic solder balls located on the second substrate side remote from the chip and coupled with the metallic circuitry, the second substrate side with the solder balls facing in the same direction as the active side of the semiconductor chip;

an underfilling adhering to a perimeter of the chip and the substrate adjacent to the perimeter; and a heat dissipating member extending through the center opening and adhered to the active side of the chip by means of a non-conductive adhesive, wherein the second side of the chip is exposed so that both sides of the semiconductor chip may dissipate heat.

13. The thin enhanced TAB BGA package of claim 12, wherein the metallic circuitry comprises a material selected from a group consisting of gold, aluminum, copper, iron, nickel and their alloys.

14. The thin enhanced TAB BGA package of claim 12 further comprising a plurality of bonding pads located on the active side the semiconductor chip coupled with the inner leads.

15. The thin enhanced TAB BGA package of claim 14, wherein coupling of the inner leads with the bonding pads is done by taping and is accompanied by press adhering of the heat dissipating member to the active side of the chip.

16. The thin enhanced TAB BGA package of claim 12, wherein the non-conductive adhesive is a dual-sided adhesive tape.

17. The thin enhanced TAB BGA package of claim 12, wherein the heat dissipating member is made of a material selected from a group consisting of aluminum, copper, iron, nickel, gold, and their alloys.

18. The thin enhanced TAB BGA package of claim 12, wherein the heat dissipating member has a step shaped cross-sectional configuration, a center portion having a greatest thickness and engaging the chip, an intermediate portion having a medium thickness and engaging the inner leads, and an outskirt portion having a least thickness and engaging the substrate, the heat dissipating member also positioning and supporting the chip, inner leads and substrate.

19. The thin enhanced TAB BGA package of claim 18, wherein the heat dissipating member has non-conductive adhesive located on surfaces adhering to the chip, inner leads and substrate.

20. The thin enhanced TAB BGA package of claim 12 further comprising an underfilling adhering to a perimeter of the chip and a substrate surface adjacent the perimeter.

* * * * *